United States Patent
Son et al.

(10) Patent No.: US 7,473,996 B2
(45) Date of Patent: Jan. 6, 2009

(54) SIGNAL TRANSFER FILM, DISPLAY APPARATUS HAVING THE SAME AND METHOD OF MANUFACTURING THE SAME

(75) Inventors: Sun-Kyu Son, Suwon-si (KR); Sin-Gu Kang, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 450 days.

(21) Appl. No.: 11/321,682

(22) Filed: Dec. 28, 2005

(65) Prior Publication Data

US 2006/0148128 A1 Jul. 6, 2006

(30) Foreign Application Priority Data

Jan. 6, 2005 (KR) .................. 10-2005-0001198

(51) Int. Cl.
*H01L 23/48* (2006.01)
*H01L 21/44* (2006.01)
*H01L 21/48* (2006.01)

(52) U.S. Cl. ............... 257/735; 438/127; 257/E21.506; 257/E23.039; 257/E23.06; 257/E23.123

(58) Field of Classification Search .......... 257/E21.499, 257/E21.502, E21.506, E21.511, E23.001, 257/E23.002, E23.004, E23.01, E23.014, 257/E23.031, E23.039, E23.056, E23.06, 257/E23.116, E23.123
See application file for complete search history.

(56) References Cited

U.S. PATENT DOCUMENTS 3,611,061 A * 10/1971 Segerson .................. 257/667

\* cited by examiner

*Primary Examiner*—Scott B Geyer
(74) *Attorney, Agent, or Firm*—MacPherson Kwok Chen & Heid LLP (57) ABSTRACT

A signal transfer film includes a base film, a lead line formed on the base film and a passivation layer protecting the lead line. The passivation layer includes a nonlinear edge portion formed at a boundary region between the lead line and the passivation layer. The nonlinear edge portion of the passivation layer disperses a stress concentrated to the boundary region in various directions when the base film is bent. Thus, the signal transfer film may prevent breaking of the lead line, thereby enhancing yield thereof.

13 Claims, 7 Drawing Sheets

SIGNAL TRANSFER FILM, DISPLAY APPARATUS HAVING THE SAME AND METHOD OF MANUFACTURING THE SAME

CROSS-REFERENCE TO RELATED APPLICATIONS

This application relies for priority upon Korean Patent Application No. 2005-1198 filed on Jan. 6, 2005, the contents of which are herein incorporated by reference in its entirety.

BACKGROUND OF THE INVENTION

1. Field of the Invention

The present invention relates to a signal transfer film, a display apparatus having the same and a method of manufacturing the same. More particularly, the present invention relates to a signal transfer film capable of enhancing yield thereof, a display apparatus having the signal transfer film and a method of manufacturing the signal transfer film.

2. Description of the Related Art

In general, a liquid crystal display apparatus displays an image using optical and electrical properties of liquid crystal, such as an anisotropic refractive index and an anisotropic dielectric constant.

The liquid crystal display apparatus includes a liquid crystal display panel that displays the image using a light and a backlight assembly that supplies the light to the liquid crystal display panel. The liquid crystal display panel includes a gate tape carrier package attached to a source side thereof and a data tape carrier package attached to a data side thereof. The gate and data tape carrier packages apply a driving signal and a timing signal.

Figure 1:
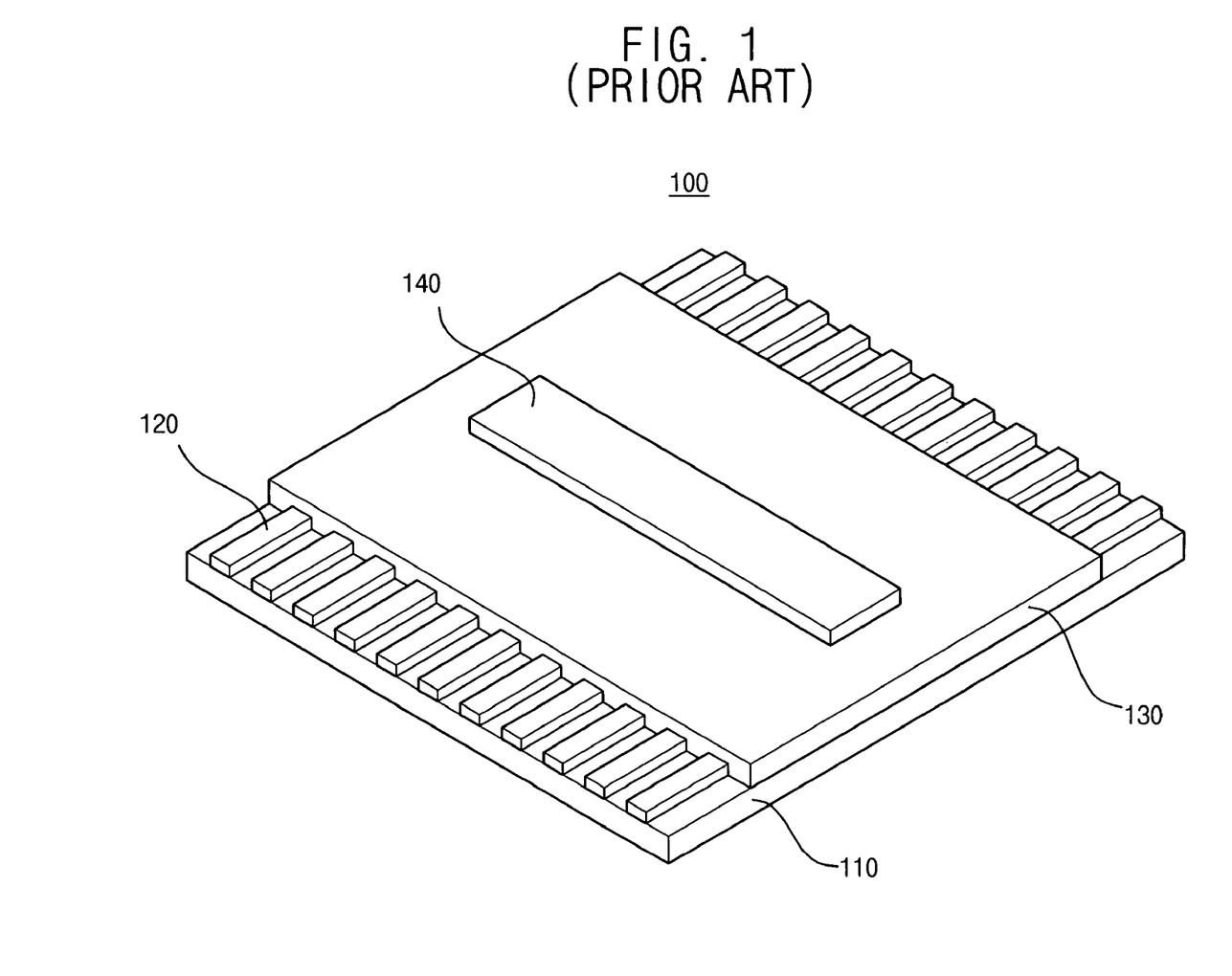
FIG. 1 is a perspective view showing a conventional tape carrier package.

FIG. 1 is a perspective view showing a conventional tape carrier package 100.

Referring to FIG. 1, the conventional tape carrier package 100 includes a flexible base film 110, lead lines 120 formed on the base film 110 to transmit an electrical signal, a passivation layer 130 formed on the base film 110 to protect the lead lines 120 and an integrated circuit chip 140 formed on the base film 110 and electrically connected to the lead lines 120.

The passivation layer 130 is partially removed from the base film 110 so that portions of the lead lines 120 adjacent to a first end and a second end opposite to the first end of the base film 110 are exposed. A boundary between the lead lines 120 and the passivation layer 130 has a substantially straight-line shape.

The first end of the base film 110 is attached to a printed circuit board and the second end of the base film 110 is attached to the liquid crystal display panel. The tape carrier package 100 is outwardly bent along a side face of a receiving container into which the liquid crystal display panel is received, and the printed circuit board is disposed on a rear face of the receiving container.

The tape carrier package 100 has strength at a region on which the passivation layer 130 is formed, where it is stronger than the first and second ends on which the passivation layer 130 is not formed.

Thus, when the base film 110 is outwardly bent along the side face of the receiving container, stress concentration occurs at a boundary region between the region on which the passivation layer 130 is formed and the first and second ends on which the passivation layer 130 is not formed.

The concentrated stress advances along ends of the passivation layer 130 since the stress advances in a substantially perpendicular direction to a direction to which a pressure is applied. As a result, the lead lines 120 are often broken down along the boundary region between the region on which the passivation layer 130 is formed and the first and second ends on which the passivation layer 130 is not formed.

When the lead lines 120 of the tape carrier package 100 are broken down due to the concentrated stress, the driving signal and timing signal from the tape carrier package 100 are not properly transmitted to the liquid crystal display panel. Thus, the image is abnormally displayed on the liquid crystal display apparatus.

SUMMARY OF THE INVENTION

In accordance with the present invention, a signal transfer film capable of enhancing yield thereof is provided.

In accordance with the present invention, a display apparatus having the above signal transfer film is provided.

In accordance with the present invention, a method suitable for manufacturing the above signal transfer film is provided.

In one aspect of the present invention, a signal transfer film includes a base film on which an integrated circuit chip is formed, a lead line and a passivation layer.

The lead line is formed on the base film and electrically connected to the integrated circuit chip so as to transmit a signal to the integrated circuit chip and receive the signal from the integrated circuit chip. The passivation layer is formed over the base film such that an end of the lead line is exposed so as to protect the lead line. The passivation layer has a nonlinear edge portion formed at a boundary region between the exposed lead line and the passivation layer.

In another aspect of the present invention, a display apparatus includes a display panel, a printed circuit board and a signal transfer film.

The display panel displays an image in response to an image signal. The printed circuit board generates the image signal. The signal transfer film is electrically connected to the printed circuit board and the display panel.

The signal transfer film includes a base film on which an integrated circuit chip is formed, a lead line and a passivation layer. The integrated circuit chip generates a driving signal corresponding to the image signal from the printed circuit board. The lead line is electrically connected to the integrated circuit chip and formed on the base film. The lead line transmits the driving signal from the integrated circuit chip to the liquid crystal display panel and transmits the image signal from the printed circuit board to the integrated circuit chip. The passivation layer is formed over the base film such that an end of the lead line is exposed. The passivation layer has a nonlinear edge portion formed at a boundary region between the exposed lead line and the passivation layer.

In still another aspect of the present invention, in a manufacturing method of a signal transfer film, a lead line including a conductive metal material is formed on a base film. A passivation layer is formed over the base film such that an end of the lead line is exposed. The passivation layer has a nonlinear edge portion formed at a boundary region between the exposed lead line and the passivation layer. An integrated circuit chip is mounted onto the base film on which the passivation layer is formed such that the integrated circuit chip is electrically connected to the lead line.

According to the above, the nonlinear edge portion of the passivation layer disperses a stress concentrated on the boundary region in various directions when the base film is bent. Thus, the signal transfer film may prevent breaking of the lead line, thereby enhancing yield thereof.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Hereinafter, the present invention will be explained in detail with reference to the accompanying drawings.

Figure 2:
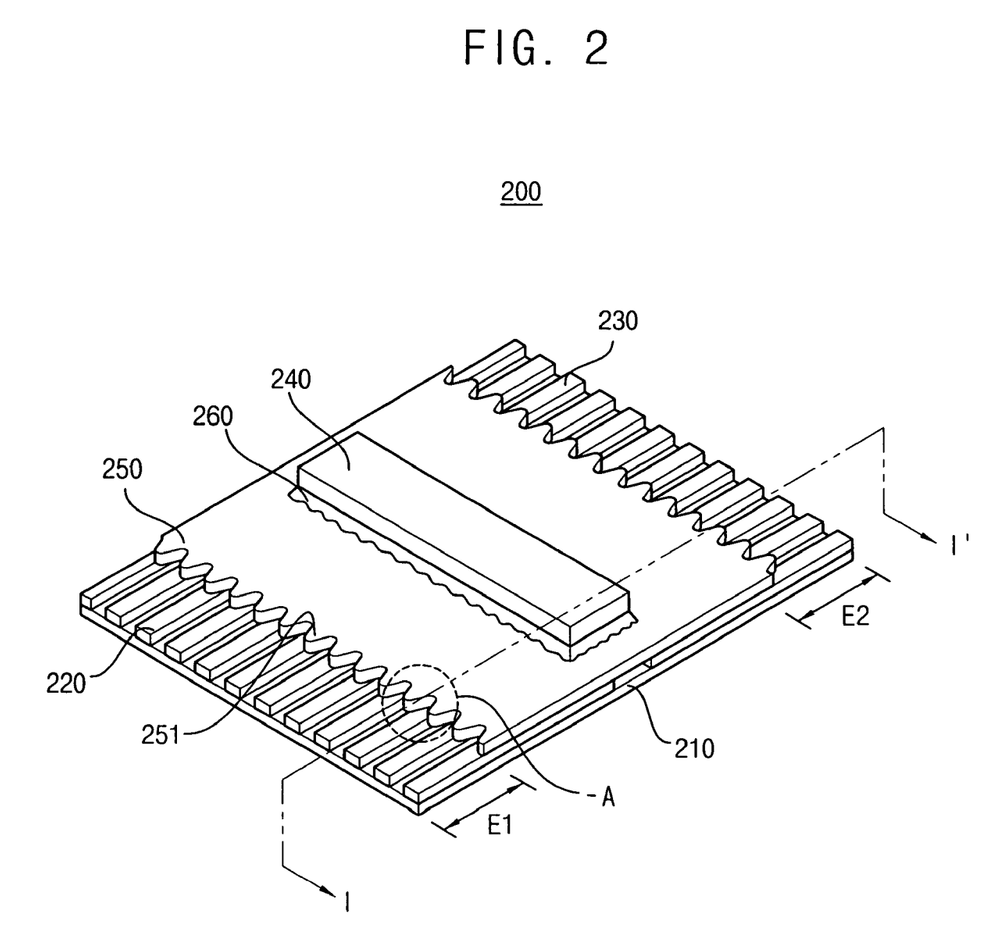
FIG. 2 is a perspective view showing a signal transfer film according to an exemplary embodiment of the present invention.

FIG. 2 is a perspective view showing a signal transfer film according to an exemplary embodiment of the present invention.

Referring to FIG. 2, a signal transfer film 200 includes a base film 210, a plurality of first lead lines 220 formed on the base film 210, a plurality of second lead lines 230 formed on the base film 210, an integrated circuit chip 240, for example, such as a semiconductor chip, mounted on the base film 210 such that input/output terminals are electrically connected to the first and second lead lines 220 and 230, a passivation layer 250 to protect the first and second lead lines 220 and 230 and an adhesive resin 260 to adhere the integrated circuit chip 240 to the base film 210.

In the present embodiment, the base film 210 includes a flexible material such as polyimide.

The first and second lead lines 220 and 230 formed on the base film 210 include a conductive material such as copper (Cu). The first and second lead lines 220 and 230 are electrically connected to the integrated circuit chip 240 so as to transmit input signals to and from the integrated circuit chip 240. The first and second lead lines 220 and 230 are substantially symmetrical to each other with reference to the integrated circuit chip 240. The first lead lines 220 extend from the integrated circuit chip 240 to a first end E1 of the base film 210, and the second lead lines 230 extend from the integrated circuit chip 240 to a second end E2 of the base film 210, which is opposite to the first end E1.

The first lead lines 220 act as input lead lines that transmit signals inputted from an external device to the integrated circuit chip 240, and the second lead lines 230 act as output lead lines that transmit signals outputted from the integrated circuit chip 240 to the external device.

The passivation layer 250 is formed on the base film 210 on which the first and second lead lines 220 and 230 are formed, so as to protect the first and second lead lines 220 and 230.

The passivation layer 250 is formed on the base film 210 except for the first and second ends E1 and E2 of the base film 210, such that end portions of the first and second lead lines 220 and 230 are exposed, thereby allowing the first and second lead lines 220 and 230 to be electrically connected to the external device.

The end portions of the first the second lead lines 220 and 230 formed on the first and second ends E1 and E2 of the base film 210 are electrically connected to the external device such as a liquid crystal display apparatus.

The passivation layer 250 includes boundary portions having at least one nonlinear edge portion 251 (shown in FIG. 4), which a re adjacent to the first and second ends E1 and E2 of the base film 210.

The passivation layer 250 includes an organic material and is formed by a silk-screen printing method.

The integrated circuit chip 240 is adhered to the base film 210 using the adhesive resin 260. The adhesive resin 260 is disposed between the integrated circuit chip 240 and the base film 210 to surround a lower lateral portion of the integrated circuit chip 240.

Figure 3:
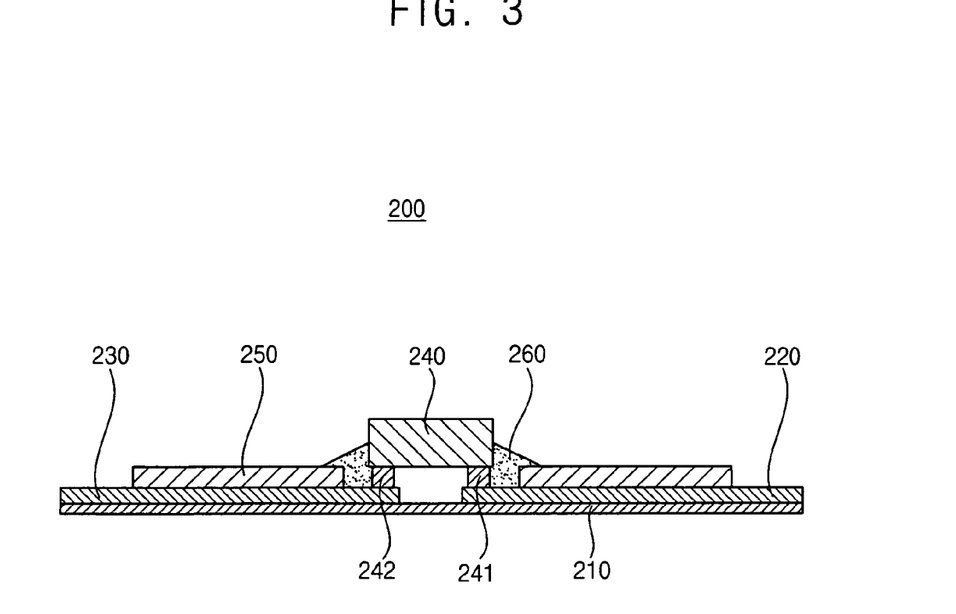
FIG. 3 is a cross-sectional view taken along a line I-I' showing the signal transfer film in FIG. 2.

FIG. 3 is a cross-sectional view taken along a line I-I' showing the signal transfer film in FIG. 2.

Referring to FIG. 3, the first lead lines 220, the second lead lines 230 and the passivation layer 250 are sequentially formed on the base film 210. Pad portions of the first and second lead lines 220 and 230 are positioned on a center portion of the base film 210 and are electrically connected to the integrated circuit chip 240. The passivation layer 250 is formed on the base film 210 such that the pad portions of the first and second lead lines 220 and 230 are exposed and end portions of the first and second lead lines 220 and 230 are exposed.

The signal transfer film 200 further includes a plurality of first bumps 241 and a plurality of second bumps 242. The first and second bumps 241 and 242 are disposed under the integrated circuit chip 240. The first bumps 241 are electrically connected to the pad portions of the first lead lines 220, respectively, and the second bumps 242 are also electrically connected to the pad portions of the second lead lines 230, respectively. Also, the first and second bumps 241 and 242 are electrically connected to the integrated circuit chip 240.

The adhesive resin 260 used to adhere the integrated circuit chip 240 to the base film 210 surrounds the lower lateral portion of the integrated circuit chip 240 and covers a predetermined portion of the passivation layer 250 adjacent to the integrated circuit chip 240.

Figure 4:
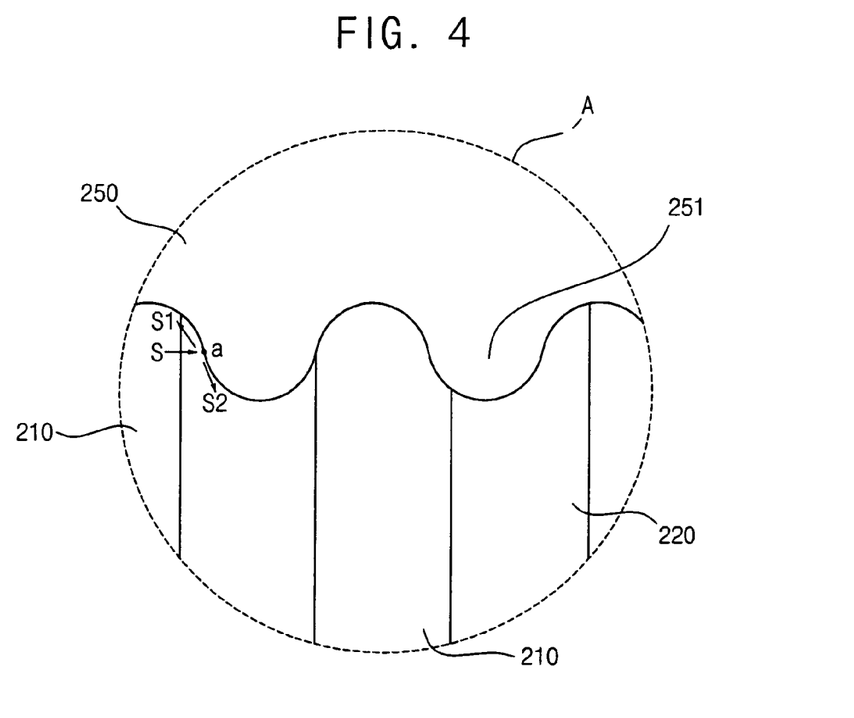
FIG. 4 is an enlarged view showing a portion "A" of the signal transfer film in FIG. 2.

FIG. 4 is an enlarged view showing a portion "A" of the signal transfer film in FIG. 1. In the present embodiment, the nonlinear edge portion 251 adjacent to the first end E1 of the base film 210 has a same structure and function as those of the nonlinear edge portion 251 adjacent to the second end E2 of the base film 210, and thus a detailed description of the nonlinear edge portion 251 on the second end E2 will be omitted.

Referring to FIGS. 2 and 4, the nonlinear edge portion 251 is disposed adjacent to the first end E1 of the base film 210. In the present embodiment, the nonlinear edge portion 251 may have various shapes such as a sinusoidal shape (as shown in FIGS. 2 and 4), a crenulated shape, a crenelated shape, a serrated shape, and so on.

The base film 210 may be freely deformed and received into a small space since the base film 210 includes the flexible material. Thus, the signal transfer film 200 may be received into a receiving container for the liquid crystal display apparatus while the signal transfer film 200 is bending. That is, the base film 210 may be received into the receiving container while the center portion of the base film 210 is bent with respect to the first and second ends E1 and E2 thereof.

When the base film 210 is bent, stress (S) is concentrated at the nonlinear edge portion 251 where the end of the passivation layer 250 meets the first lead lines 220.

In other words, since the passivation layer 250 is not formed on the first and second ends E1 and E2 of the base film 210, the base film 210 has lower strength at the first and second ends E1 and E2 of the base film 210 than the region on which the passivation layer 250 is formed. Thus, the stress (S) is concentrated at the nonlinear edge portion 251 where the strength of the base film 210 changes.

The concentrated stress (S) advances from the first end E1 of the base film 210 to the center portion of the base film 210 since the concentrated stress (S) advances in a substantially perpendicular direction to a direction to which a pressure is applied.

For example, when the stress (S) is concentrated at a point 'a' as shown in FIG. 4, the concentrated stress (S) is advanced toward two directions. That is, a portion of the stress (S) advances along a first direction S1 toward the end of the passivation layer 250 and a remaining portion of the stress (S) is advanced along a second direction S2 substantially opposite to the first direction S1.

The nonlinear edge portion 251 of the passivation layer 250 meets the lead lines 220 at an oblique angle relative to the direction of travel of the lead line. Accordingly, the nonlinear edge portion 251 of the passivation layer 250 disperses the stress (S) in various directions along the length of the lead line. Thus, the signal transfer film 200 may prevent breaking of the first lead lines 220 along a region where the end of the passivation layer 250 meets the first lead lines 220.

Although not shown in figures, the nonlinear edge portion 251 is also formed at a region where the end of the passivation layer 250 meets the second lead lines 230.

When the base film 210 is bent, the stress (S) is concentrated at the nonlinear edge portion 251 where the end of the passivation layer 250 meets the second lead lines 230.

The concentrated stress (S) advances from the second end E2 of the base film 210 to the center portion of the base film 210 since the stress advances in a substantially perpendicular direction to a direction to which a pressure is applied.

The concentrated stress (S) advanced along the nonlinear edge portion 251 is dispersed in various directions due to the nonlinear edge portion 251 of the passivation layer 250. Thus, the signal transfer film 200 may prevent breaking of the second lead lines 230 along a region where the end of the passivation layer 250 meets the second lead lines 230.

Figure 5:
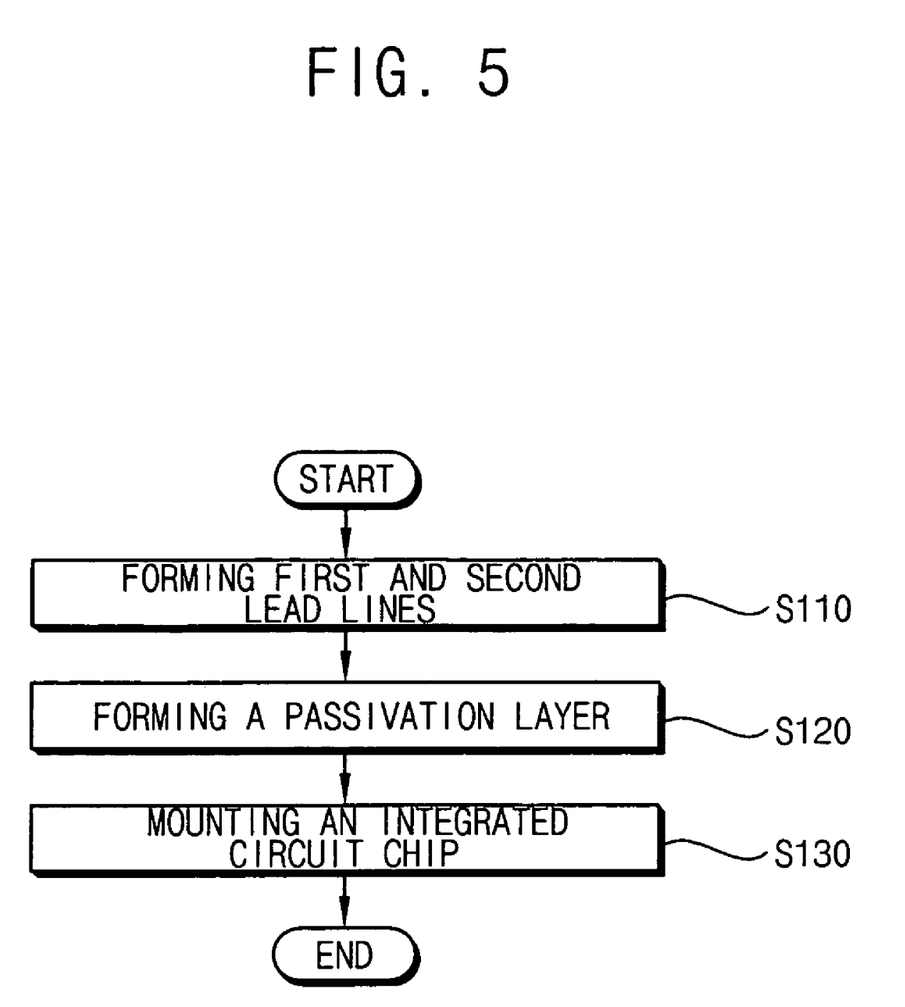
FIG. 5 is a flow chart illustrating a manufacturing method of the signal transfer film shown in FIG. 2.

FIG. 5 is a flow chart illustrating a manufacturing method of the signal transfer film shown in FIG. 2.

Referring to FIGS. 2 and 5, a conductive metal layer is formed on the base film 210. The conductive metal layer is patterned to form the first and second lead lines 220 and 230 (S110).

The organic material is coated over the base film 210 on which the first and second lead lines 220 and 230 are formed using a silk screen printing method, thereby forming the passivation layer 250 (S120).

The passivation layer 250 is formed on the base film 210 except for the first and second ends E1 and E2 and the center portion of the base film 210 using the silk screen printing method to expose the end portions and the pad portions of the first and second lead lines 220 and 230. When the passivation layer 250 is formed on the base film 210 except for the first and second ends E1 and E2 of the base film 210, the passivation layer 250 includes the nonlinear edge portion 251 at the region where the end of the passivation layer 250 meets the first lead lines 220.

The integrated circuit chip 240 is mounted on the base film 210 on which the passivation layer 250 is formed (S130). The integrated circuit chip 240 is mounted on the center portion of the base film 210 and electrically connected to the pad portions of the first and second lead lines 220 and 230 through the first and second bumps 241 and 242, respectively.

Figure 6:
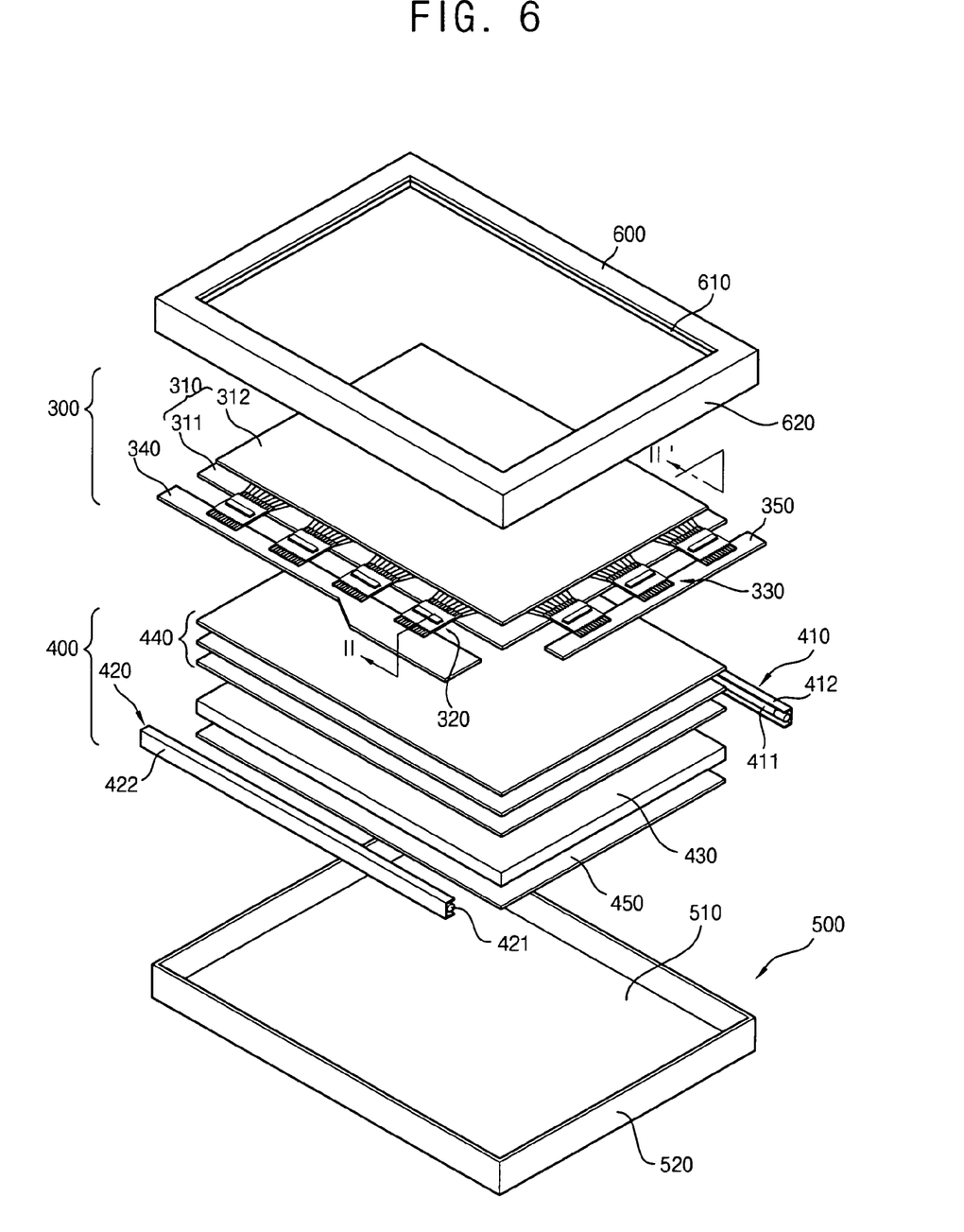
FIG. 6 is an exploded perspective view showing a liquid crystal display apparatus according to an exemplary embodiment of the present invention.

FIG. 6 is an exploded perspective view showing a liquid crystal display apparatus according to an exemplary embodiment of the present invention.

Referring to FIG. 6, a liquid crystal display apparatus includes a display panel assembly 300 that displays an image using a light, a backlight assembly 400 that emits the light, a receiving container 500 that receives the display panel assembly 300 and the backlight assembly 400, and a top chassis 600 that guides the display panel assembly 300.

In particular, the display panel assembly 300 includes a liquid crystal display panel 310 that receives the light and displays the image in response to an image signal, data and gate signal transfer films 320 and 330 that transmit the image signal to the liquid crystal display panel 310, and data and gate printed circuit boards 340 and 350 that generate the image signal.

The backlight assembly 400 is disposed under the display panel assembly 300 so as to uniformly illuminate the liquid crystal display panel 310.

The backlight assembly 400 includes first and second lamp units 410 and 420 that emit light in response to a power voltage externally provided, a light guide plate 430 that guides the light to the liquid crystal display panel 310, optical sheets 440 that control brightness of the light, and a reflecting sheet 450 that reflects the light.

The first and second lamp units 410 and 420 emit light in response to the power voltage externally provided. The first and second lamp units 410 and 420 are disposed adjacent to a first side and a second side opposite to the first side of the light guide plate 430, respectively.

In the present embodiment, the first and second lamp units 410 and 420 have substantially the same function and structure. Thus, the first lamp unit 410 will be described in detail and any further detailed description of the second lamp unit 420 will be omitted.

The first lamp unit 410 includes a first lamp 411 that emits the light and a first lamp reflector 412 that reflects the light from the first lamp 411 to the light guide plate 430.

The first lamp 411 includes discharge gas injected there into and a fluorescent layer formed on an inner face thereof to emit light in response to the power voltage.

The first lamp reflector 412 receives the first lamp 411. The first lamp reflector 412 partially covers the first lamp 411 and reflects the light from the first lamp 411 to the light guide plate 430 through an exposed side of the first light reflector 412.

The light guide plate 430 is disposed between the first lamp unit 410 and the second lamp unit 420. The light guide plate 430 guides the light from the first and second lamp units 410 and 420 such that the light is supplied to the liquid crystal display panel 310.

The optical sheets 440 are disposed on the light guide plate 430. The optical sheets 440 improve brightness characteristics of the light and supply the improved light to the liquid crystal display panel 310. In the present embodiment, an example of the optical sheets 440 may have various sheets, for example, such as a diffusion sheet for diffusing the light, a prism sheet for condensing the light, or the like.

The reflecting sheet 450 is disposed under the light guide plate 430. The reflecting sheet 450 reflects the light that leaks from the light guide plate 430 back to the light guide plate 430, thereby improving light efficiency.

The liquid crystal display panel 310 and the backlight assembly 400 are received in the receiving container 500. The receiving container 500 includes a bottom portion 510 on which the backlight assembly 400 is disposed and a side portion 520 which extends from an edge of the bottom portion 510.

The top chassis 600 is disposed on the liquid crystal display panel 310. The top chassis 600 includes an upper portion 610 that is partially opened to expose an effective display area of the liquid crystal display panel 310 and a side portion 620 which extends from an edge of the upper portion 610. The top chassis 600 covers the edges of the liquid crystal display panel 310 while exposing the effective display area of the liquid crystal display panel 310. The top chassis 600 is coupled to the receiving container 500 so as to fix the liquid crystal display panel 310 to the receiving container 500.

Figure 7:
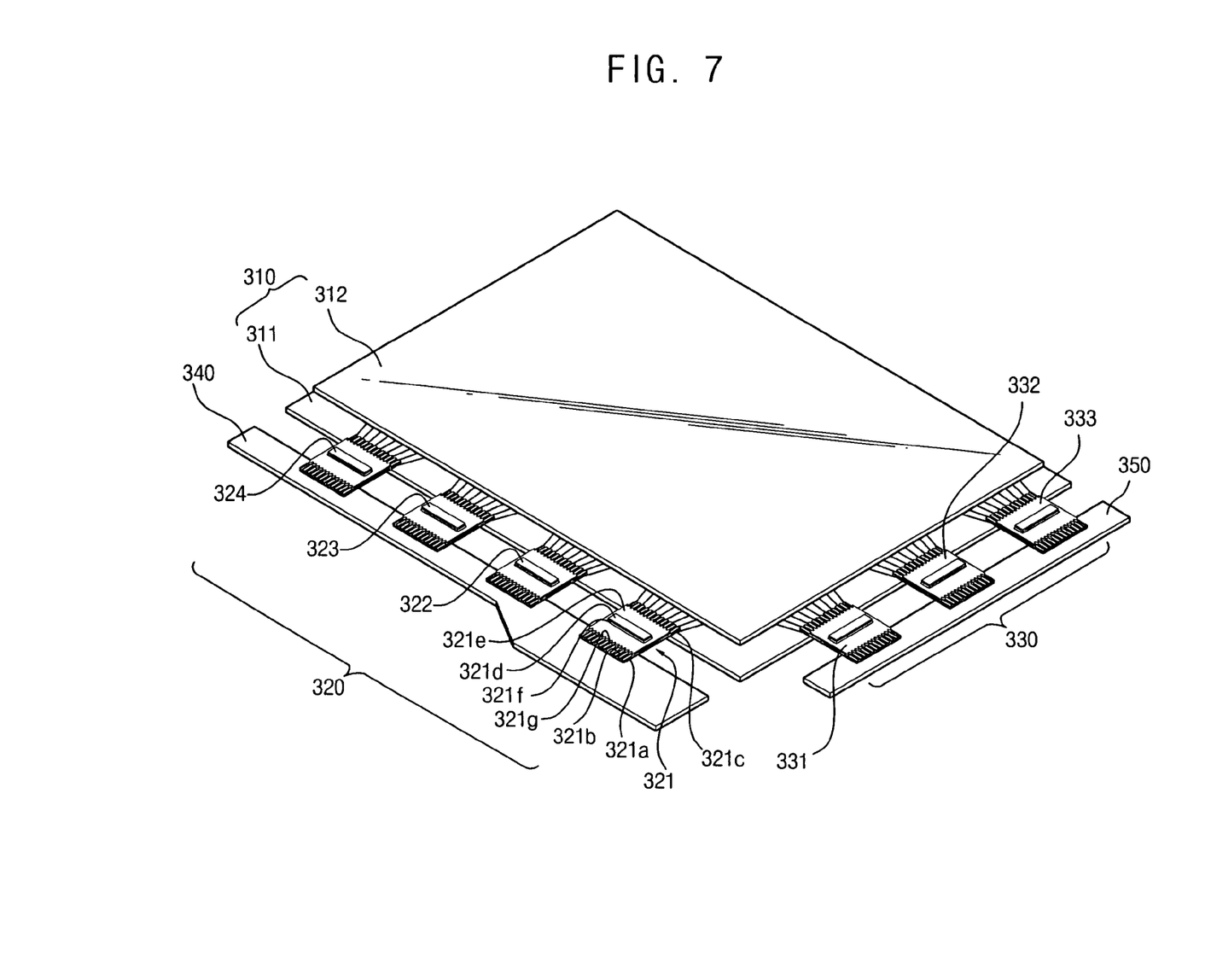
FIG. 7 is a perspective view showing a display panel assembly in FIG. 6.

FIG. 7 is a perspective view showing the display panel assembly of FIG. 6.

Referring to FIG. 7, the liquid crystal display panel 310 has a thin film transistor (TFT) substrate 311, a color filter substrate 312 coupled to the TFT substrate 311 and a liquid crystal layer (not shown) disposed between the TFT substrate 311 and the color filter substrate 312.

The TFT substrate 311 is a transparent glass substrate on which TFTs are formed in a matrix configuration. Each of the TFTs has a gate line (not shown) extending in a first direction, a data line (not shown) extending in a second direction substantially perpendicular to the first direction and a pixel electrode.

RGB pixels (not shown), which are color pixels for emitting predetermined colors when the light passes therethrough, are formed on the color filter substrate 312 by a thin film process. The color filter substrate 312 further has a common electrode (not shown) formed thereon.

When power is applied to a gate of the TFT and the TFT is turned on, an electric field is generated between the pixel electrode and the common electrode of the color filter substrate 312. The electric field varies an alignment angle of liquid crystal molecules of the liquid crystal layer interposed between the TFT substrate 311 and the color filter substrate 312. Thus, the transmittance of light through the liquid crystal varies in accordance with the variation of the alignment angle of the liquid crystal, so a desired image may be obtained.

The data signal transfer films 320 are attached to a source side of the liquid crystal display panel 310 and the gate signal transfer films 330 are attached to a gate side of the liquid crystal display panel 310. The data and gate signal transfer films 320 and 330 are attached to the liquid crystal display panel 310 using an anisotropic conductive film.

The data signal transfer films 320 are electrically connected to the data line. In the present embodiment, the data signal transfer films 320 include a first data signal transfer film 321, a second data signal transfer film 322, a third data signal transfer film 323 and a fourth data signal transfer film 324. The number of data signal transfer films 320 may be increased or decreased depending on the size of the liquid crystal display panel 310.

The first, second, third and fourth data signal transfer films 321, 322, 323 and 324 receive the image signal from the data printed circuit board 340 to transmit a driving signal and a data signal for the liquid crystal display panel 310.

The gate signal transfer films 330 are electrically connected to the gate line. In the present embodiment, the gate signal transfer films 330 include a first gate signal transfer film 331, a second gate signal transfer film 332 and a third gate signal transfer film 333. The number of gate signal transfer films 330 may be increased or decreased depending on the size of the liquid crystal display panel 310.

The first, second and third gate signal transfer films 331, 332 and 333 receive the image signal from the gate printed circuit board 350 to transmit a driving signal and a gate signal for the liquid crystal display panel 310.

In the present embodiment, the data signal transfer films 320 have substantially the same function and structure as those of the gate signal transfer films 330, and thus any further detailed description of the gate signal transfer films 330 will be omitted. Further, the first, second, third and fourth data signal transfer films 320 have substantially the same function and structure with each other, and thus the first data signal transfer film 321 will be described.

The first data signal transfer film 321 includes a flexible base film 321a, first and second lead lines 321b and 321c formed on the base film 321a, an integrated circuit chip 321d mounted on a center portion of the base film 321a to generate the driving signal and the timing signal corresponding to the image signal, a passivation layer 321e protecting the first and second lead lines 321b and 321c, and an adhesive resin 321f adhering the integrated circuit chip 321d to the base film 321a.

The first lead lines 321b are electrically connected to the data printed circuit board 340 to receive the image signal from the data printed circuit board 340. The first lead lines 321b transmit the image signal to the integrated circuit chip 321c.

The second lead lines 321c of the first data signal transfer film 321 are electrically connected to the TFT substrate 311 of the liquid crystal display panel 310. The second lead lines 321c receive the driving signal and the timing signal from the integrated circuit chip 321d and transmit the driving signal and the timing signal to the TFT substrate 311.

The integrated circuit chip 321d mounted on the center portion of the base film 321a is adhered to the base film 321a and the passivation layer 321e by means of the adhesive resin 321f.

The passivation layer 321e protects the first and second lead lines 321b and 321c formed on the base film 321a. The passivation layer 321e includes the nonlinear edge portion 321g at the region where the ends of the passivation layer 321e are adjacent to the liquid crystal display panel 310 and the data printed circuit board 340.

The first lead lines formed on the first, second and third gate signal transfer films 331, 332 and 333 are electrically connected to the gate printed circuit board 350 to receive the image signal from the gate printed circuit board 350.

The second lead lines formed on the first, second and third gate signal transfer films 331, 332 and 333 are electrically connected to the liquid crystal display panel 310. The second lead lines receive the driving signal and the gate signal from the integrated circuit chips formed on the first, second and third gate signal transfer films 331, 332 and 333 and supply the driving signal and the gate signal to the liquid crystal display panel 310.

Figure 8:
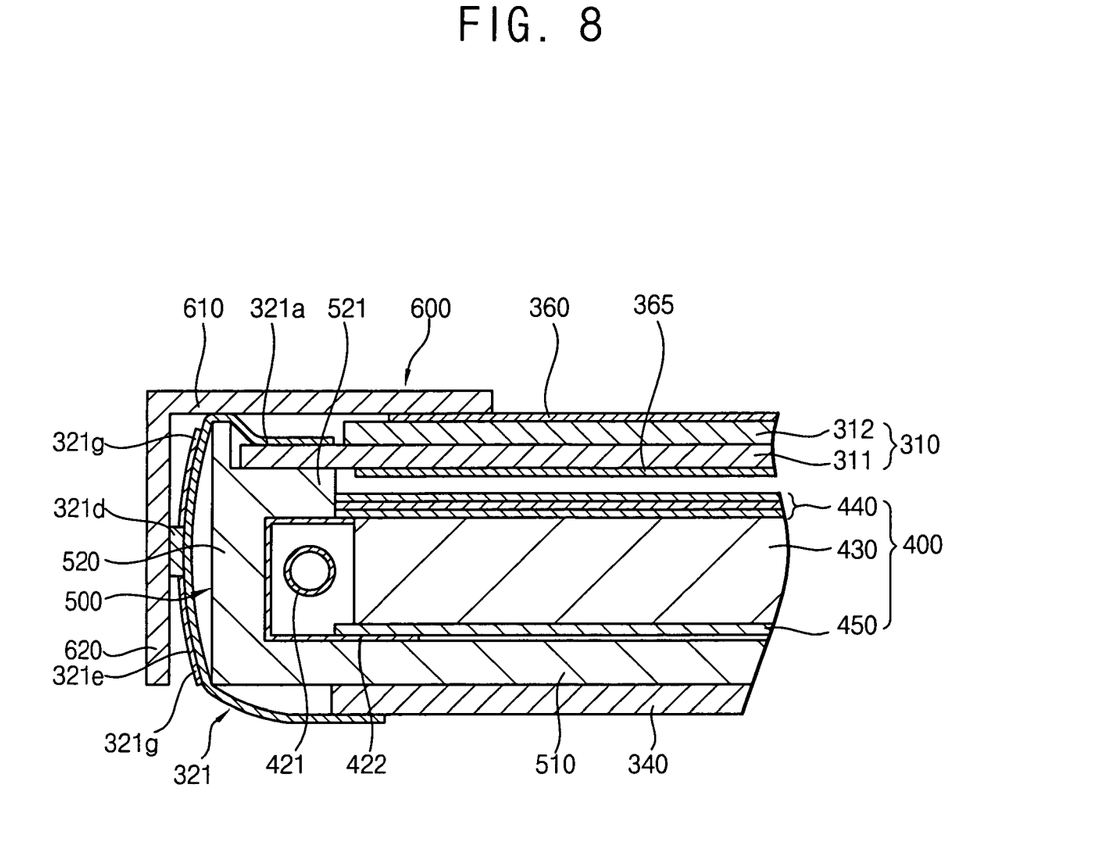
FIG. 8 is a cross-sectional view taken along a line II-II' showing the liquid crystal display apparatus in FIG. 6.

FIG. 8 is a cross-sectional view taken along a line II-II' showing the liquid crystal display apparatus in FIG. 6.

Referring to FIGS. 7 and 8, the reflecting plate 450, the light guide plate 430 and the optical sheets 440 are sequentially disposed on the bottom portion 510 of the receiving container 500. The second lamp 421 and the second lamp reflector 422 are disposed between the light guide plate 430 and the side portion 520 of the receiving container 500.

The liquid crystal display panel 310 is disposed on a stepped portion 521 formed on the side portion 520 of the receiving container 500.

The liquid crystal display apparatus 310 further includes a first polarizing film 360 and a second polarizing film 365. The first and second polarizing films 360 and 365 are attached to an upper face and a lower face of the liquid crystal display panel 310, respectively, to polarize the light in a predetermined direction.

The first data signal transfer film 321 attached to the source side of the liquid crystal display panel 310 is bent along the side portion 520 of the receiving container 500, and the data printed circuit board 340 electrically connected to the first data signal transfer film 321 is disposed on a rear face of the receiving container 500.

The base film 321a of the first data signal transfer film 321 is bent along the side portion 520 of the receiving container 500 and is attached to the TFT substrate 311. Thus, the integrated circuit chip 321d mounted on the first data signal transfer film 321 is disposed between the side portion 520 of the receiving container 510 and the side portion 620 of the top chassis 600.

Since the base film 321a is bent along the side portion 520 of the receiving container 500, the integrated circuit chip 321d substantially makes contact with the side portion 620 of the top chassis 600. Thus, the nonlinear edge portion 321g of the passivation layer 321e is positioned adjacent to a corner of the side portion 520 of the receiving container 500.

When the base film 321a is bent around the corner of the side portion 520, the stress is concentrated at the nonlinear edge portion 321g where the end of the passivation layer 321e meets the first lead lines 321b and the second lead lines 321c.

The stress is dispersed to various directions due to the nonlinear edge portion 321g formed at the first data signal transfer film 321. Thus, the first data signal transfer film 321 may prevent breaking of the first and second lead lines 321b and 321c along the region where the edge of the passivation layer 321e meets the first and second lines 321b and 321c.

According to the above, the signal transfer films include a passivation layer to protect the first and second lead lines. The passivation layer includes a nonlinear edge portion formed at the region where the edge of the passivation layer meets the first and second lines. The stress generated due to bending of the signal transfer film along the side portion of the receiving container is dispersed in various directions along the nonlinear edge portion. Thus, the signal transfer film may prevent breaking of the first and second lead lines, thereby enhancing yield thereof.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A signal transfer film comprising:
    a base film on which an integrated circuit chip is formed;
    a lead line to transmit a signal to the integrated circuit chip and receive the signal from the integrated circuit chip, the lead line being electrically connected to the integrated circuit chip and formed on the base film; and
    a passivation layer formed over the base film such that an end of the lead line is exposed, the passivation layer having a nonlinear edge portion formed at a boundary region between the exposed lead line and the passivation layer.

2. The signal transfer film of claim 1, wherein the nonlinear edge portion is continuously formed along an edge of the passivation layer.

3. The signal transfer film of claim 1, wherein the passivation layer comprises an organic material.

4. The signal transfer film of claim 1, wherein the nonlinear edge portion comprises a substantially sinusoidal shape.

5. The signal transfer film of claim 1, wherein the nonlinear edge portion comprises a crenulated shape, a crenulated shape, or a serrated shape.

6. A display apparatus comprising:
    a display panel to display an image in response to an image signal;
    a printed circuit board to generate the image signal; and
    a signal transfer film electrically connected to the printed circuit board and the display panel, comprising:
        a base film on which an integrated circuit chip is formed to generate a driving signal corresponding to the image signal;
        a lead line to transmit the driving signal from the integrated circuit chip to the liquid crystal display panel and transmit the image signal from the printed circuit board to the integrated circuit chip, the lead line being electrically connected to the integrated circuit chip and formed on the base film; and
        a passivation layer formed over the base film such that an end of the lead line is exposed, the passivation layer having a nonlinear edge portion formed at a boundary region between the exposed lead line and the passivation layer.

7. The display apparatus of claim 6, wherein the nonlinear edge portion is continuously formed along an edge of the passivation layer.

8. The display apparatus of claim 6, wherein the nonlinear edge portion comprises a substantially sinusoidal shape.

9. The display apparatus of claim 6, further comprising a receiving container to receive the display panel.

10. The display apparatus of claim 9, wherein the signal transfer film is bent along a side portion of the receiving container.

11. A method of manufacturing a signal transfer film, comprising:
    forming a lead line on a base film, the lead line including a conductive metal material;
    forming a passivation layer over the base film such that an end of the lead line is exposed, the passivation layer having a nonlinear edge portion formed at a boundary region between the exposed lead line and the passivation layer; and
    mounting an integrated circuit chip onto the base film on which the passivation layer is formed, the integrated circuit chip being electrically connected to the lead line.

12. The method of claim 11, wherein the passivation layer comprises an organic material, and the passivation layer is formed using a silk screen method.

13. The method of claim 11, wherein the nonlinear edge portion comprises a substantially sinusoidal shape.

* * * * *